(12) United States Patent
Kim (10) Patent No.: US 9,640,601 B2
(45) Date of Patent: May 2, 2017

(54) DISPLAY APPARATUS

(71) Applicant: Samsung Display Co., Ltd., Yongin-si (KR)

(72) Inventor: Hyunyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/988,119

(22) Filed: Jan. 5, 2016

(65) Prior Publication Data

US 2016/0204177 A1     Jul. 14, 2016

(30) Foreign Application Priority Data

Jan. 8, 2015   (KR) .................. 10-2015-0002854

(51) Int. Cl.
*H01L 27/12*     (2006.01)
*H01L 27/32*     (2006.01)

(52) U.S. Cl.
CPC ........ *H01L 27/3276* (2013.01); *H01L 27/124* (2013.01); *H01L 27/1222* (2013.01); *H01L 27/1255* (2013.01)

(58) Field of Classification Search
CPC . H01L 27/12; H01L 27/1255; H01L 27/3265; H01L 27/3267; G09G 3/3225
See application file for complete search history.

(56) References Cited

U.S. PATENT DOCUMENTS

| | | | | |
|---|---|---|---|---|
| 6,194,837 | B1 * | 2/2001 | Ozawa ................ | G09G 3/3225 313/506 |
| 2003/0141811 | A1 * | 7/2003 | Park ................... | H01L 27/1255 313/506 |
| 2006/0290633 | A1 * | 12/2006 | Choi .................. | H01L 27/12 345/92 |
| 2011/0128211 | A1 * | 6/2011 | Ono .................... | H01L 27/3265 345/76 |
| 2013/0027378 | A1 | 1/2013 | Lee et al. | |
| 2013/0193439 | A1 * | 8/2013 | Ahn ................... | H01L 27/1255 257/59 |
| 2014/0034923 | A1 | 2/2014 | Kim et al. | |
| 2014/0070184 | A1 | 3/2014 | Shin | |
| 2015/0048335 | A1 * | 2/2015 | Chung ............... | H01L 27/3267 257/40 |

FOREIGN PATENT DOCUMENTS

| | | |
|---|---|---|
| KR | 10-2013-0012382 | 2/2013 |
| KR | 10-2014-0018623 | 2/2014 |
| KR | 10-2014-0035156 | 3/2014 |
| KR | 10-2014-0079093 | 6/2014 |

* cited by examiner

*Primary Examiner* — Kenneth Parker
*Assistant Examiner* — Fang-Xing Jiang
(74) *Attorney, Agent, or Firm* — H.C. Park & Associates, PLC (57) ABSTRACT

A display apparatus including a pixel including a first thin-film transistor (TFT) and a second TFT connected to the first TFT, the display apparatus includes a substrate, a semiconductor layer disposed on the substrate and including an active region of the first TFT and an active region of the second TFT, a first gate layer disposed on the semiconductor layer and including a gate of the first TFT and a gate of the second TFT, a second gate layer disposed on the first gate layer and including a connection node connecting the gate of the first TFT to the active region of the second TFT, and a line layer disposed on the second gate layer and configured to supply a driving voltage to the pixel.

10 Claims, 9 Drawing Sheets

DISPLAY APPARATUS

RELATED APPLICATION

This application claims priority from and the benefit of Korean Patent Application No. 10-2015-0002854, filed on Jan. 8, 2015, which is hereby incorporated by reference for all purposes as if fully set forth herein.

BACKGROUND

Field

Exemplary embodiments of the present invention relate to a display apparatus. More particularly, the exemplary embodiments of the present invention relate to a display apparatus with reduced parasitic capacitance.

Discussion of the Background

Forming a thin-film transistor by using a semiconductor thin layer formed on a glass substrate may reduce manufacturing cost and render subsequent processes easier than semiconductor apparatuses using a semiconductor substrate. Accordingly, a thin-film semiconductor apparatus such as a flat panel display apparatus may be used in various fields.

High luminance, low operating voltage, and self-emitting light characteristics of an organic light-emitting display apparatus may provide a high contrast ratio and an ultra-thin display. Since a response time of the organic light-emitting display apparatus may be several microseconds (µs), the organic light-emitting display apparatus may also stably realize a moving image. In addition, since the organic light-emitting display apparatus may have a wide viewing angle, higher stability at a low temperature, and may be driven with a low voltage of direct current (DC) 5 V to 15 V, manufacturing and designing a driving circuit of the organic light-emitting display apparatus, and a manufacturing process thereof may be simplified.

The organic light-emitting display apparatus may include pixels including an organic light-emitting device that self-emits light, thin-film transistors, and a capacitor for driving the organic light-emitting device. When a gap between a pixel electrode and a connection line that connects a driving thin-film transistor to another thin-film transistor is narrow, a parasitic capacitance may occur due to coupling between the connection line and the pixel electrode. Accordingly, potential deviation may occur at a gate of the driving thin-film transistor, which may cause smear and color deviation when asymmetrically designing the pixel electrode or various lines.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display apparatus in which a gap between a pixel electrode and a connection line that connects a driving thin-film transistor to another thin-film transistor is increased to prevent potential deviation at a gate of the driving thin-film transistor.

Additional aspects will be set forth in part in the description which follows and, in part, will be apparent from the description, or may be learned by practice of the inventive concept.

According to an exemplary embodiment of the present invention, a display apparatus including a pixel including a first thin-film transistor (TFT) and a second TFT connected to the first TFT, the display apparatus includes a substrate, a semiconductor layer disposed on the substrate, the semiconductor layer including an active region of the first TFT and an active region of the second TFT, a first gate layer disposed on the semiconductor layer, the first gate layer including a gate of the first TFT and a gate of the second TFT, a second gate layer disposed on the first gate layer, the second gate layer including a connection node connecting the gate of the first TFT to the active region of the second TFT, and a line layer disposed on the second gate layer, the line layer configured to supply a driving voltage to the pixel.

The display apparatus may further include a first insulating layer disposed between the semiconductor layer and the first gate layer, and a second insulating layer disposed between the first gate layer and the second gate layer.

The display apparatus may further include a capacitor including a lower electrode and an upper electrode, in which the lower electrode includes the gate of the first TFT.

The second gate layer may include the upper electrode.

The connection node may include a contact region connected to the gate of the first TFT through a first contact plug, and the contact region may be surrounded by the upper electrode, the upper electrode at least partially having a U-shape.

The display apparatus may further include a third gate layer disposed between the second gate layer and the line layer, the third gate layer including the upper electrode.

The display apparatus may further include a third insulating layer disposed between the second gate layer and the third gate layer.

The line layer may include the upper electrode.

The display apparatus may further include a fourth insulating layer disposed between the second gate layer and the line layer.

The display apparatus may further include a pixel electrode disposed on the line layer to overlap the first TFT, the second TFT, the capacitor, and the connection node, and a fifth insulating layer disposed between the line layer and the pixel electrode.

A portion of the fifth insulating layer overlapping the pixel electrode may protrude toward the pixel electrode.

The connection node may be connected to the active region of the second TFT through a second contact plug, and the second TFT may diode-connect the first TFT.

According to an exemplary embodiment of the present invention, a display apparatus including a pixel including a first thin-film transistor (TFT), a second TFT connected to the first TFT, and a capacitor, the display apparatus includes a substrate, a semiconductor layer disposed on the substrate, the semiconductor layer including an active region of the first TFT and an active region of the second TFT, a first gate layer disposed on the semiconductor layer, the first gate layer including a gate of the first TFT and a gate of the second TFT, and a second gate layer disposed on the first gate layer, the second gate layer including a connection node connecting the gate of the first TFT to the active region of the second TFT, in which the capacitor includes a lower electrode and an upper electrode, the lower electrode includes the gate of the first TFT, and the upper electrode includes a portion of the second gate layer.

The display apparatus may further include a first insulating layer disposed between the semiconductor layer and the first gate layer, and a second insulating layer disposed between the first gate layer and the second gate layer.

The display apparatus may further include a line layer disposed on the second gate layer, the line layer configured to supply a driving voltage to the pixel.

According to an exemplary embodiment of the present invention, a display apparatus including a pixel including a first thin-film transistor (TFT), a second TFT connected to the first TFT, and a capacitor, the display apparatus includes a substrate, a semiconductor layer disposed on the substrate, the semiconductor layer including an active region of the first TFT and an active region of the second TFT, a first gate layer disposed on the semiconductor layer, the first gate layer including a gate of the first TFT and a gate of the second TFT, a second gate layer disposed on the first gate layer, the second gate layer including a connection node connecting the gate of the first TFT to the active region of the second TFT, and a metal layer disposed on the second gate layer, in which the capacitor includes a lower electrode and an upper electrode, the lower electrode includes the gate of the first TFT, and the upper electrode includes a portion of the metal layer.

The display apparatus may further include a first insulating layer disposed between the semiconductor layer and the first gate layer, and a second insulating layer disposed between the first gate layer and the second gate layer.

The display apparatus may further include a line layer disposed on the metal layer, the line layer configured to supply a driving voltage to the pixel, a third insulating layer disposed between the second gate layer and the metal layer, and a fourth insulating layer disposed between the metal layer and the line layer.

The metal layer may further include a line layer disposed in a region other than a region in which the upper electrode is disposed, and the line layer may be configured to supply a driving voltage to the pixel.

The display apparatus may further include a fourth insulating layer disposed between the second gate layer and the metal layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
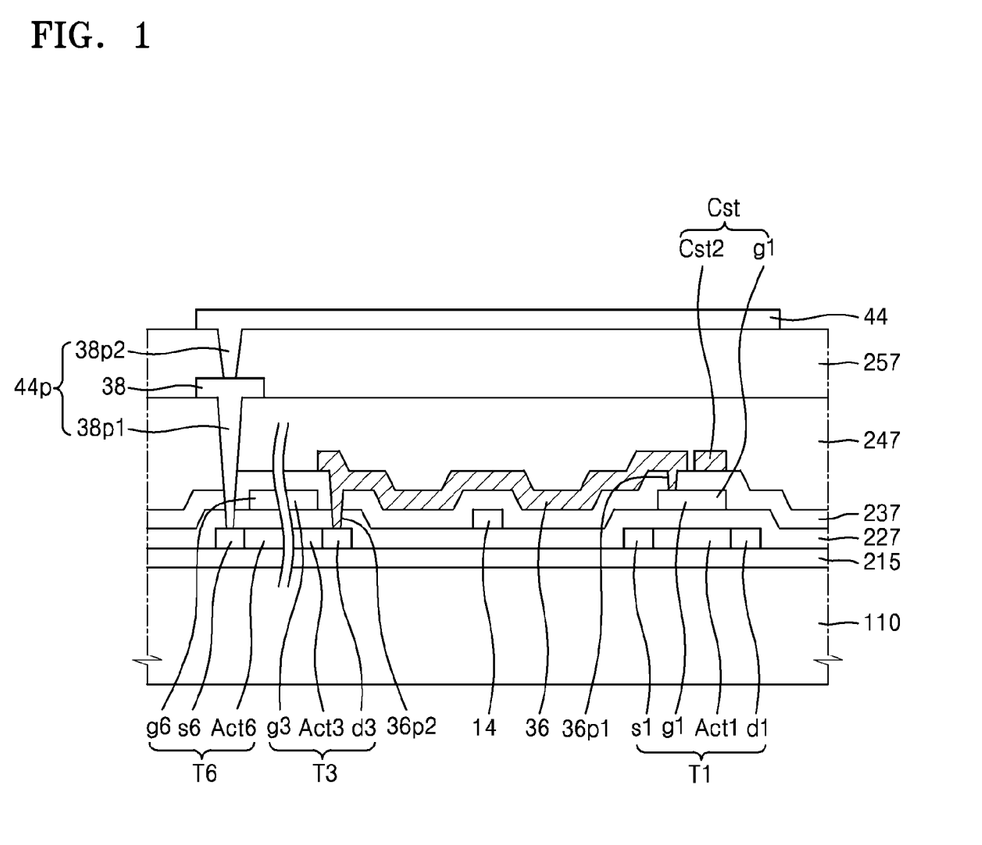
FIG. 1 is a cross-sectional view schematically illustrating one pixel of a display apparatus according to an exemplary embodiment of the present invention.
Figure 2:
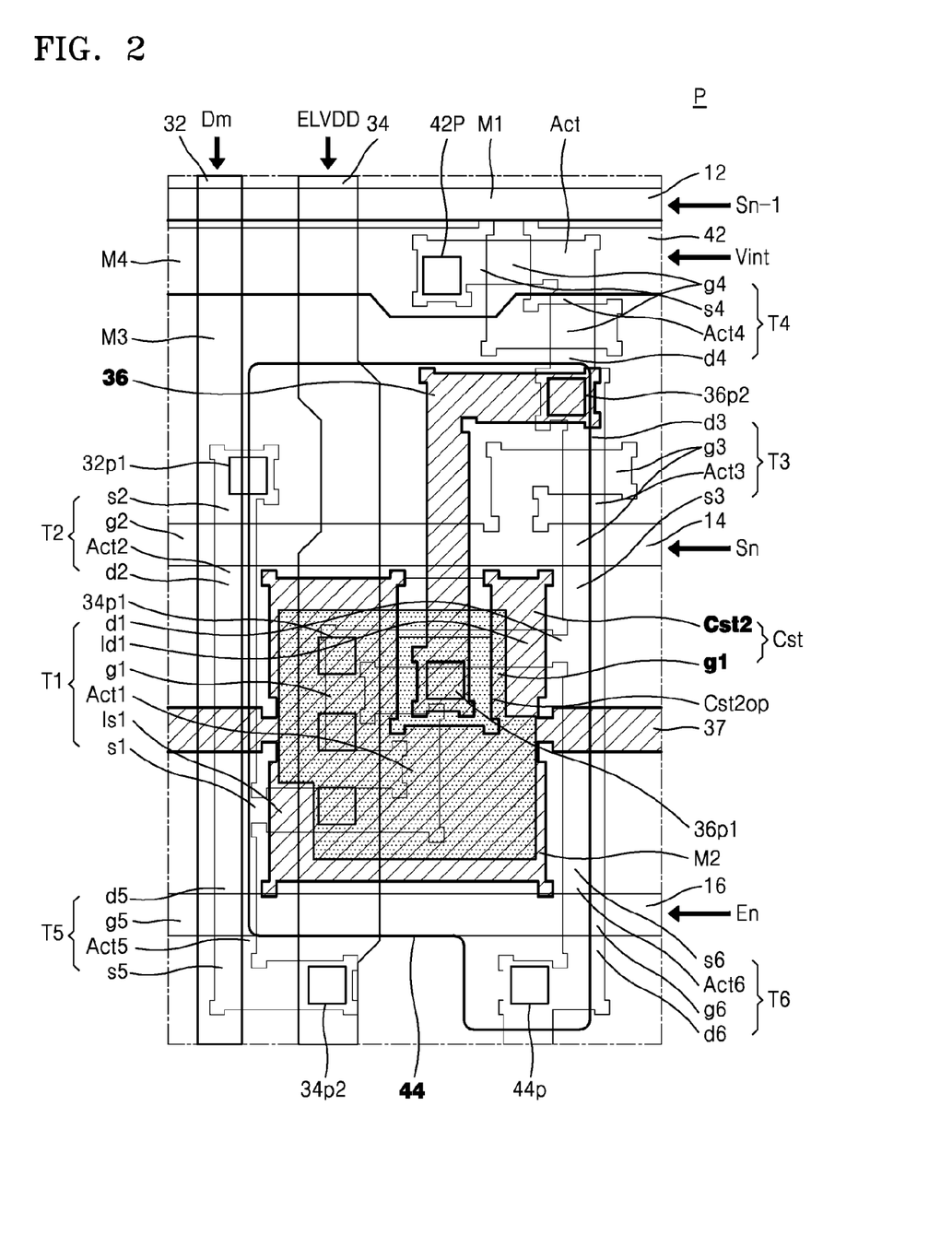
FIG. 2 is a plan view schematically illustrating a pixel circuit of the one pixel of the display apparatus of FIG. 1.

FIG. 1 is a cross-sectional view schematically illustrating one pixel of a display apparatus according to an exemplary embodiment of the present invention, and FIG. 2 is a plan view schematically illustrating a pixel circuit of the one pixel of the display apparatus of FIG. 1.

Hereinafter, a structure of the display apparatus according to an exemplary embodiment of the present invention will be described in detail with reference to FIGS. 1 and 2. The display apparatus may refer to a display apparatus that include a thin-film transistor (TFT). The display apparatus may be a flat panel display apparatus such as an organic light-emitting display apparatus, a liquid crystal display (LCD) apparatus, or the like.

In FIGS. 1 and 2, for convenience of a description, layers which are formed between a substrate 110 and a pixel electrode 44 are illustrated. In FIG. 2, a description on a structure of a TFT will focus on a driving TFT T1 and a compensation TFT T3. A storage capacitor will be described together. Furthermore, other TFTs (T2 to T6) may have the same stacked structure as that of each of the driving TFT T1 and the compensation TFT T3, and thus, repeated description thereof will be omitted.

The substrate 110 may be an insulating substrate formed of a transparent plastic material or a transparent glass material with silicon oxide ($SiO_2$) as a main component. Alternatively, the substrate 110 may be a conductive substrate formed of a thin-film metal material, a flexible substrate, or a rigid substrate.

A buffer layer 215 for preventing diffusion of impurity ions and penetration of moisture or external air may be formed on the substrate, to provide a planarized surface. The buffer layer 215 may include an inorganic insulating material such as silicon oxide, silicon nitride, silicon oxynitride, aluminum oxide, aluminum nitride, titanium oxide, or titanium nitride. Alternatively, the buffer layer 215 may include an organic insulating material such as polyimide, polyester, or acryl. The buffer layer 215 may be formed of a stacked body of the materials or a stacked body of an organic insulating material and an inorganic insulating material. The buffer layer 215 may be omitted depending on a processing condition.

A semiconductor layer Act including an active region of each TFT is formed on the buffer layer 215. In FIG. 2, for convenience of a description, a driving active pattern Act1, a portion of a compensation active pattern Act3, and a portion of an emission control active pattern Act6 are illustrated. The driving active pattern Act1 includes a driving channel region, and a driving source region s1 and a driving drain region d1 that face each other with the driving channel region therebetween. Each of the compensation active pattern Act3 and the emission control active pattern Act6 includes a channel region, a source region, and a drain region. In FIG. 1, a drain region d3 of the compensation active pattern Act3 and a source region s6 of the emission control active pattern Act6 are illustrated.

A first insulating layer 227 formed of SiNx or $SiO_2$ may be disposed on the driving active pattern Act1, the compensation active pattern Act3, and the emission control active pattern Act6.

A first gate layer (g1 to g6, 12, 14, and 16), which includes a gate electrode g1 of the driving TFT T1, a gate electrode g3 of the compensation TFT T3, and a gate electrode g6 of the emission control TFT T6, is formed on the first insulating layer 227. In this case, a driving gate electrode g1 of the driving TFT T1 may act as a lower electrode of a storage capacitor Cst.

As illustrated in FIG. 2, the first gate layer (g1, g2, g3, g4, g5, g6, 12, 14, and 16) includes a driving gate electrode g1, a first scan line 14 including a switching gate electrode g2 and the compensation gate electrode g3, a second scan line 12 including an initialization gate electrode g4, and an emission control line 16 including an operation control gate electrode g5 and an emission control gate electrode g6.

The driving gate electrode g1 is separated from the second scan line 12, the first scan line 14, and the emission control line 16, and overlaps a driving channel region of the driving active pattern Act1 in the form of a floating electrode. In FIG. 2, an area corresponding to the driving gate electrode g1 is illustrated as a dotted area. The compensation gate electrode g3 is connected to the first scan line 14, and the compensation gate electrode g3 overlaps a compensation channel region of the compensation active pattern Act3. The initialization gate electrode g4 is connected to the second scan line 12, and overlaps an initialization channel region of an initialization active pattern Act4.

The first gate layer (g1 to g6, 12, 14, and 16) and first insulating layer 227 are covered by a second insulating layer 237. The second insulating layer 237 is formed of SiNx or $SiO_2$.

A second gate layer (Cst2, 36 and 37), which includes an upper electrode Cst2 of the storage capacitor Cst, a connection node 36 that connects the driving TFT T1 to the compensation TFT T3, and a connection line 37 that connects upper electrodes Cst2 of respective pixels, are formed on the second insulating layer 237.

The upper electrode Cst2 configures the storage capacitor Cst by overlapping the driving gate electrode g1, which acts as a lower electrode, in the form of the floating electrode. As illustrated in FIG. 2, the upper electrode Cst2 may have a U-shape where one side is opened in a direction of the connection node 36.

A contact hole, which exposes the driving gate electrode g1 acting as a lower electrode of the storage capacitor Cst, is formed in the second insulating layer 237, and a first contact plug 36p1 is formed to fill the contact hole. One end of the connection node 36 includes a contact region which is connected to the driving gate electrode g1 of the driving TFT T1 through the first contact plug 36p1, and the contact region is formed to be surrounded by the upper electrode Cst2 which at least partially has a U-shape. The other end of the connection node 36 is connected to the driving active pattern Act3 of the compensation TFT T3 through a second contact plug 36p2, and the second contact plug 36p2 fills the contact hole which is formed in each of the first and second insulating layers 227 and 237 to expose the compensation drain region d3. Therefore, the connection node 36 connects the driving gate electrode g1 of the driving TFT T1 to the compensation active pattern Act3 of the compensation TFT T3. More particularly, the connection node 36 is connected to the compensation active pattern Act3 of the compensation TFT T3 through the second contact plug 36p2, and thus, the compensation TFT T3 diode-connects the driving TFT T1.

The connection line 37 is formed to connect the upper electrodes Cst2 of the respective pixels in a direction where the first scan line 14 extends. Therefore, the connection line 37 forms a mesh structure with a driving voltage line 34 which is formed to intersect the first scan line 14.

A fourth insulating layer 247 is formed on the second insulating layer 237 and the upper electrode Cst2. The fourth insulating layer 247 is formed of a ceramic-based material such as SiNx or SiO$_2$.

A line layer (32, 34, and 38) is formed on the fourth insulating layer 247, and includes the driving voltage line 34, a data line 32, and a connection member 38. The driving voltage line 34 and the data line 32 are formed in a direction intersecting the first scan line 14. The driving voltage line 34 is connected to the upper electrode Cst2 of the storage capacitor Cst through a driving voltage line contact plug 34p1, and receives a driving voltage ELVDD from the driving voltage line 34. The data line 32 transfers a data signal Dm to a corresponding pixel.

A drain region d6 of the emission control TFT T6 is connected to the connection member 38 through a third contact plug 38p1 that passes through the first insulating layer 227, the second insulating layer 237, and the fourth insulating layer 247.

A fifth insulating layer 257, which covers the data line 32, the driving voltage line 34, and the connection member 38, is formed on the fourth insulating layer 247. The fifth insulating layer 257 may be formed of an inorganic insulating material containing oxide, nitride, and/or oxynitride, or may be formed of an organic insulating material.

A pixel electrode 44 is formed on the fifth insulating layer 257. The pixel electrode 44 is connected to the connection member 38 through a contact plug 38p2 that passes through the fifth insulating layer 257. The contact plug 44p of FIG. 1 includes the contact plug 38p1 which is connected between the drain region d6 and the pixel electrode 44, the connection member 38, and the contact plug 38p2.

Although not shown, a pixel defining layer is formed at an edge of the pixel electrode 44 and on the fifth insulating layer 257, and includes an opening that exposes the pixel electrode 44. The pixel defining layer may be formed of an organic material, such as polyacrylate resin or polyimide, or a silica-based inorganic material. An organic emission layer (not illustrated) may be formed on the pixel electrode 44 exposed by a pixel opening (not illustrated), and a common electrode (not illustrated) is formed on the organic emission layer. In this way, an organic light-emitting diode (OLED) including the pixel electrode 44, the organic emission layer, and the common electrode is formed.

The pixel electrode 44 may be an anode which is a hole injection electrode, and the common electrode may be a cathode which is an electron injection electrode. Alternatively, the pixel electrode 44 may be the cathode, and the common electrode may be the anode, based on a method of driving the organic light-emitting display apparatus. A hole and an electron are injected from the pixel electrode 44 and the common electrode into the organic emission layer, and an exciton which is generated by combining the injected hole and electron is shifted from an excited state to a ground state to emit light.

The organic emission layer is formed of a low-molecular weight organic material or a polymeric organic material such as poly 3,4-ethylenedioxythiophene (PEDOT). The organic emission layer may also be formed of a multilayer which includes an emission layer and one or more selected from a hole injection layer (HIL), a hole transporting layer (HTL), an electron transporting layer (ETL), and an electron injection layer (EIL). When the organic emission layer includes all the layers, the hole injection layer (HIL) is disposed on the pixel electrode 44 that is an anode, and the hole transporting layer (HTL), the emission layer, the electron transporting layer (ETL), and the electron injection layer (EIL) are sequentially stacked on the hole injection layer. The common electrode is formed of a reflective conductive material, and thus, the organic light-emitting display apparatus is a bottom emission type. A reflective conductive material may include lithium (Li), calcium (Ca), LiF/Ca, LiF/Al, aluminum (Al), silver (Ag), magnesium (Mg), or gold (Au).

Figure 3:
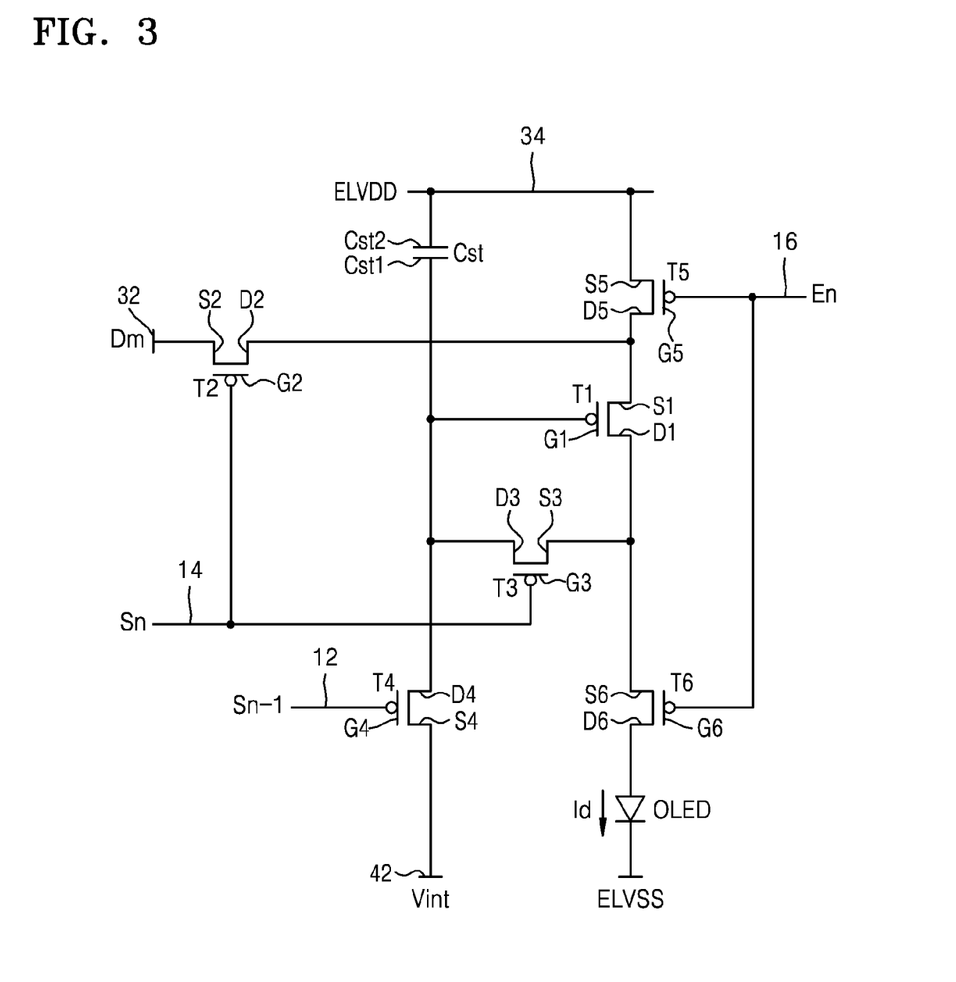
FIG. 3 illustrates an equivalent circuit diagram of the one pixel of the display apparatus of FIG. 1, according to an exemplary embodiment of the present invention
Figure 4:
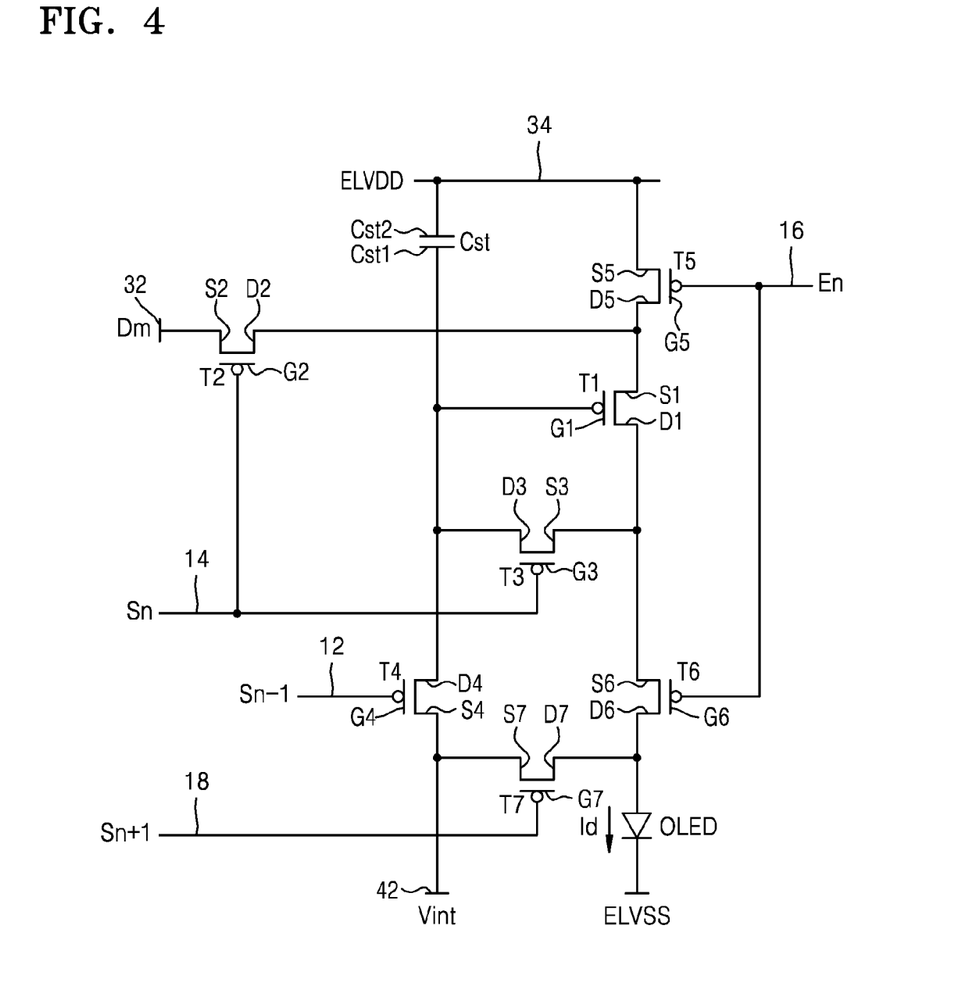
FIG. 4 illustrates an equivalent circuit diagram of the one pixel of the display apparatus of FIG. 1, according to an exemplary embodiment of the present invention.

FIG. 3 illustrates an equivalent circuit diagram of the one pixel of the display apparatus of FIG. 1, according to an exemplary embodiment of the present invention. FIG. 4 illustrates an equivalent circuit diagram of the one pixel of the display apparatus of FIG. 1, according to an exemplary embodiment of the present invention.

As illustrated in FIG. 3, one pixel of an organic light-emitting display apparatus according to an exemplary embodiment of the present invention includes signal lines 12, 14, 16, 32, 34, and 42 and a pixel circuit that is connected to the signal lines 12, 14, 16, 32, 34 and 42. The pixel circuit includes TFTs T1 to T6 and a storage capacitor Cst. The pixel also includes an organic light-emitting diode OLED that emits light with a driving current supplied through the pixel circuit.

The TFTs T1 to T6 may include a driving TFT T1, a switching TFT T2, a compensation TFT T3, an initialization TFT T4, an operation control TFT T5, and an emission control TFT T6.

The signal lines 12, 14, 16, 32, 34, and 42 may include a first scan line 14 that transfers a first scan signal Sn, a second scan line 12 that transfers a second scan signal Sn−1 to the initialization TFT T4, an emission control line 16 that transfers an emission control signal En to the operation control TFT T5 and the emission control TFT T6, a data line 32 that intersects the first scan line 14 and transfers a data signal Dm, a driving voltage line 34 that transfers a driving voltage ELVDD and extends in parallel with the data line 32, and an initialization voltage line 42 that transfers an initialization voltage Vint for initializing the driving TFT T1.

A gate electrode G1 of the driving TFT T1 is connected to a lower electrode Cst1 of the storage capacitor Cst. A source electrode S1 of the driving TFT T1 is connected to the driving voltage line 34 via the operation control TFT T5. A drain electrode D1 of the driving TFT T1 is electrically connected to an anode of the organic light-emitting diode OLED via the emission control TFT T6. The driving TFT T1 receives the data signal Dm according to a switching operation of the switching TFT T2 to supply a driving current Id to the organic light-emitting diode OLED.

A gate electrode G2 of the switching TFT T2 is connected to the first scan line 14, and a source electrode S2 of the switching TFT T2 is connected to the data line 32. A drain electrode D2 of the switching TFT T2 is connected to the source electrode S1 of the driving TFT T1 and is connected to the driving voltage line 34 via the operation control TFT T5. The switching TFT T2 may be turned on according to the first scan signal Sn supplied through the first scan line 14, and may perform a switching operation that transfers the data signal Dm, supplied through the data line 32, to a source electrode of the driving TFT T1.

A gate electrode G3 of the compensation TFT T3 is connected to the first scan line 14. A source electrode S3 of the compensation TFT T3 is connected to the drain electrode D1 of the driving TFT T1 and is connected to the anode of the organic light-emitting diode OLED via the emission control TFT T6. A drain electrode D3 of the compensation TFT T3 is connected in common to the lower electrode Cst1 of the storage capacitor Cst, a drain electrode D4 of the initialization TFT T4, and the gate electrode G1 of the driving TFT T1. The compensation TFT T3 is turned on according to the first scan signal Sn supplied through the first scan line 14, and connects the gate electrode G1 and drain electrode D1 of the driving TFT T1 to diode-connect the driving TFT T1.

A gate electrode G4 of the initialization TFT T4 is connected to the second scan line 12, and a source electrode S4 of the initialization TFT T4 is connected to the initialization voltage line 42. The drain electrode D4 of the initialization TFT T4 is connected in common to the lower electrode Cst1 of the storage capacitor Cst, the drain electrode D3 of the compensation TFT T3, and the gate electrode G1 of the driving TFT T1. The initialization TFT T4 is turned on according to the second scan signal Sn−1 supplied through the second scan line 12, and performs an initialization operation that transfers an initialization voltage Vint to the gate electrode G1 of the driving TFT T1 to initialize a voltage at the gate electrode G1 of the driving TFT T1.

A gate electrode G5 of the operation control TFT T5 is connected to the emission control line 16, a source electrode S5 of the operation control TFT T5 is connected to the driving voltage line 34, and a drain electrode D5 of the operation control TFT T5 is connected in common to the source electrode S1 of the driving TFT T1 and the drain electrode D2 of the switching TFT T2.

A gate electrode G6 of the emission control TFT T6 is connected to the emission control line 16, and a source electrode S6 of the emission control TFT T6 is connected in common to the drain electrode D1 of the driving TFT T1 and the source electrode S3 of the compensation TFT T3. The drain electrode D6 of the emission control TFT T6 is connected to the anode of the organic light-emitting diode OLED. The operation control TFT T5 and the emission control TFT T6 are simultaneously turned on according to the emission control signal En supplied through the emission control line 16, and allows the driving current Id to flow in the organic light-emitting diode OLED.

The upper electrode Cst2 of the storage capacitor Cst is connected to the driving voltage line 34. The lower electrode Cst1 of the storage capacitor Cst is connected in common to the gate electrode G1 of the driving TFT T1, the drain electrode D3 of the compensation TFT T3, and the drain electrode D4 of the initialization TFT T4.

A cathode of the organic light-emitting diode OLED is connected to a common voltage ELVSS. The organic light-emitting diode OLED receives the driving current Id supplied from the driving TFT T1 to emit light, thereby displaying an image.

Hereinafter, an operation of the one pixel of the organic light-emitting display apparatus illustrated in FIG. 3 will be described in detail.

First, the second scan signal Sn−1 having a low level is supplied through the second scan line 12 during an initialization period. Then, the initialization TFT T4 is turned on in response to the second scan signal Sn−1 having a low level, and the initialization voltage Vint is supplied from the initialization voltage line 42 to the gate electrode G1 of the driving TFT T1 through initialization TFT T4, thereby the driving TFT T1 is initialized by the initialization voltage Vint.

Subsequently, during a data programming period, the first scan signal Sn having a low level is supplied through the first scan line 14. Then, the switching TFT T2 and the compensation TFT T3 are turned on in response to the first scan signal Sn having a low level. At this time, the driving TFT T1 is diode-connected by the turned-on compensation TFT T3 and is biased in a forward direction.

Then, a compensation voltage "Dm-Vth" which is obtained by subtracting a threshold voltage "Vth" of the driving TFT T1 from the data signal Dm supplied through the data line 32 is applied to the gate electrode G1 of the driving TFT T1.

The driving voltage ELVDD and the compensation voltage "Dm-Vth" are respectively applied to both ends of the storage capacitor Cst, and an electric charge corresponding to a voltage difference "ELVDD−Dm+Vth" of the both ends is stored in the storage capacitor Cst. Subsequently, during an emission period, the emission control signal En supplied from the emission control line 16 is shifted from a high level to a low level. Then, during the emission period, the operation control TFT T5 and the emission control TFT T6 are turned on by the emission control signal En having a low level.

Then, the driving current Id based on a voltage difference between a voltage at the gate electrode G1 of the driving TFT T1 and the driving voltage ELVDD is generated, and is supplied to the organic light-emitting diode OLED through the emission control TFT T6. A gate-source voltage "Vgs" of the driving TFT T1 is maintained as "ELVDD−Dm+Vth" by the storage capacitor Cst during the emission period, and according to a current-voltage relationship of the driving TFT T1, the driving current Id is proportional to the square "(ELVDD−Dm)$^2$" of a value which is obtained by subtracting the threshold voltage "Vth" from the source-gate voltage. Therefore, the driving current Id may be determined irrespective of the threshold voltage "Vth" of the driving TFT T1.

Referring to FIG. 4, additional compensation TFT T7 may be added to a pixel of a display device according to an exemplary embodiment of the present invention. Structures and operations of the TFTs T1 to T6 illustrated in FIG. 4 are as described above with reference to FIG. 3, and thus, repeated description thereof will be omitted.

In the circuit diagram of FIG. 4, a gate electrode G7 of the additional compensation TFT T7 is connected to a third scan line 18. A source electrode S7 of the seventh TFT T7 is connected to the source electrode S4 of the initialization TFT T4 and the initialization voltage line 42. A drain electrode D7 of the seventh TFT T7 is connected to the drain electrode D6 of the emission control TFT T6 and the anode of the organic light-emitting diode OLED. The seventh TFT T7 is turned on according to the third scan signal Sn+1 supplied through the third scan line 18, and applies the initialization voltage Vint to the anode of the organic light-emitting diode OLED. In FIG. 4, the first and second scan signals Sn and Sn−1 are illustrated as scan signals preceding the third scan signal Sn+1, however, the sequence of the scan signals Sn−1, Sn, and Sn+1 may vary.

Hereinafter, a structure of the pixel of the organic light-emitting diode illustrated in FIG. 3 will be described in detail with reference to FIG. 2.

Referring to FIG. 2, a pixel P of an organic light-emitting display apparatus according to an exemplary embodiment of the present invention includes the driving TFT T1, the switching TFT T2, the compensation TFT T3, the initialization TFT T4, the operation control TFT T5, the emission control TFT T6, the storage capacitor Cst, and the organic light-emitting diode OLED.

The pixel P includes the first scan line 14 through which the first scan signal Sn is applied, the second scan line 12 through which the second scan signal Sn−1 is applied, the emission control line 16 through which the emission control signal En is applied, the initialization voltage line 42 through which the initialization voltage Vint is applied, the data line 32 through which the data signal Dm is applied, and the driving voltage line 34 through which the driving voltage ELVDD is applied. The first scan line 14, the second scan line 12, the emission control line 16, and the initialization voltage line 42 extend along a row direction, and the data line 32 and the driving voltage line 34 extend along a column direction.

The pixel P may include a semiconductor layer Act, a first conductive layer M1, a second conductive layer M2, a third conductive layer M3, and a fourth conductive layer M4. Although not shown in FIG. 2, insulating layers may be disposed between the semiconductor layer Act, the first conductive layer M1, the second conductive layer M2, the third conductive layer M3, and the fourth conductive layer M4. Also, the pixel P may further include an intermediate layer (not shown) including an organic emission layer, and a common electrode layer (not shown).

The semiconductor layer Act includes active patterns Act1 to Act10 respectively corresponding to the driving TFT T1, the switching TFT T2, the compensation TFT T3, the initialization TFT T4, the operation control TFT T5, and the emission control TFT T6. The driving TFT T1, the switching TFT T2, the compensation TFT T3, the initialization TFT T4, the operation control TFT T5, and the emission control TFT T6 may be disposed along the semiconductor layer Act.

In FIG. 2, the semiconductor layer Act is illustrated as formed in one pattern in one pixel P, but the semiconductor layer Act may be formed in two or more separated patterns, depending on a design. The semiconductor layer Act may have various shapes depending on the design, and may include a bent portion as illustrated in FIG. 2.

The first conductive layer M1 may include the second scan line 12, the first scan line 14, and the emission control line 16. Also, the first conductive layer M1 may include the respective gate electrodes g1 to g6 of the driving TFT T1, the switching TFT T2, the compensation TFT T3, the initialization TFT T4, the operation control TFT T5, and the emission control TFT T6.

The second conductive layer M2 may include the upper electrode Cst2 of the storage capacitor Cst. The third conductive layer M3 may include the data line 32, the driving voltage line 34, and the connection node 36. The fourth conductive layer M4 may include the initialization voltage line 42 and the pixel electrode 44.

The semiconductor layer Act may be formed of polysilicon, and may include the channel region in which impurities are not doped, and the source region and the drain region which are respectively formed at both sides of the channel region and in which the impurities are doped. The impurities may change depending on a type of a TFT, and may be n-type impurities or p-type impurities. The semiconductor layer Act may include the driving active pattern Act1 of the driving TFT T1, the switching active pattern Act2 of the switching TFT T2, the compensation active pattern Act3 of the compensation TFT T3, the initialization active pattern Act4 of the initialization TFT T4, the operation control active pattern Act5 of the operation control TFT T5, and the emission control active pattern Act10 of the emission control TFT T6.

The driving TFT T1 includes the driving active pattern Act1 and the driving gate electrode g1. The driving active pattern Act1 may include the channel region which overlaps the driving gate electrode g1, the source region s1, and the drain region d1. The source region s1 and the drain region d1 may not overlap the driving gate electrode g1 and the upper electrode Cst2. The driving active pattern Act1 is bent.

The upper electrode Cst2 is disposed on the driving gate electrode g1. The upper electrode Cst2 includes a U-shaped opening Cst2op which at least partially surrounds a contact region in which the contact plug 36p1 connected between the driving gate electrode g1 and the connection node 36 is disposed. In FIG. 2, a shape of the opening Cst2op is illustrated as a U-shape, but the opening Cst2op may have an arbitrary shape which is opened toward the connection node 36. The upper electrode Cst2 may maximally overlap the driving gate electrode g1 except the opening Cst2op to obtain maximum capacitance is obtained.

The upper electrode Cst2 may configure the storage capacitor Cst along with the driving gate electrode g1. The driving gate electrode g1 performs a function of the lower electrode of the storage capacitor Cst.

The upper electrode Cst2 is connected to the driving voltage line 34 through the contact plug 34p1, and receives the driving voltage ELVDD from the driving voltage line 34. The driving voltage line 34 is connected to the upper electrode Cst2, and thus forms a mesh structure by intersecting the connection line 37 which connects the upper electrodes Cst2 of respective pixels. The driving voltage line 34 may supply the driving voltage ELVDD in a vertical and horizontal direction. Therefore, a region of a line through which power is supplied may expand, thereby preventing a voltage drop from internal resistance of the line.

The switching TFT T2 includes the switching active pattern Act2 and the switching gate electrode g2 which is a portion of the first scan line 14. The switching active pattern Act2 includes the channel region which overlaps the switching gate electrode g2, and the source region s2 and the drain region d2 which are respectively disposed at both sides of the channel region. The source region s2 may be connected to the data line 32 through the contact plug 32p1. The drain region d2 may be connected to the source region s1 of the driving TFT T1 along the semiconductor layer Act.

The compensation TFT T3 includes the compensation active pattern Act3 and the compensation gate electrode g3 which is a portion of the first scan line 14. The compensation active pattern Act3 includes the channel region which overlaps the compensation gate electrode g3, and the source region s3 and the drain region d3 which are respectively disposed at both sides of the channel region. The source region s3 may be connected to the drain region d1 of the driving TFT T1 along the semiconductor layer Act. The drain region d3 may be connected to the connection node 36 through the contact plug 36p2. More particularly, the drain region d3 of the compensation TFT T3 is electrically connected to the driving gate electrode g1 through the connection node 36. As illustrated in FIG. 2, the compensation gate electrode g3 is formed as a dual gate electrode, thereby preventing a current leakage.

The initialization TFT T4 includes the initialization active pattern Act4 and the initialization gate electrode g4 which is a portion of the second scan line 12. The initialization active pattern Act4 includes the channel region which overlaps the initialization gate electrode g4, and the source region s4 and the drain region d4 which are respectively disposed at both sides of the channel region. The source region s4 may be connected to the initialization voltage line 42 through a contact plug 42p. Although not shown, the contact plug 42p may include a connection member which is formed as the third conductive layer M3, a contact plug which connects the connection member to the source region s4, and a contact plug which connects the connection member to the initialization voltage line 42. The drain region d4 may be connected to the connection node 36 through the contact plug 36p2. As illustrated in FIG. 2, the initialization gate electrode g4 may be formed as a dual gate electrode.

The operation control TFT T5 includes the operation control active pattern Act5 and the operation control gate electrode g5 which is a portion of the emission control line 16. The operation control active pattern Act5 includes the channel region which overlaps the operation control gate electrode g5, and the source region s5 and the drain region d5 which are respectively disposed at both sides of the channel region. The drain region d5 may be connected to the source region s1 of the driving TFT T1 along the semiconductor layer Act. The source region s5 may be connected to the driving voltage line 34 through the contact plug 34p2.

The emission control TFT T6 includes the emission control active pattern Act6 and the emission control gate electrode g6 which is a portion of the emission control line 16. The emission control active pattern Act6 includes the channel region which overlaps the emission control gate electrode g6, and the source region s6 and the drain region d6 which are respectively disposed at both sides of the channel region. The source region d6 may be connected to the drain region d1 of the driving TFT T1 along the semiconductor layer Act. The drain region d6 may be connected to the pixel electrode 44 through the contact plug 44p. Although not shown, the contact plug 44p may include a connection member which is formed as the third conductive layer M3, a contact plug which connects the connection member to the drain region d6, and a contact plug which connects the connection member to the pixel electrode 44.

The pixel electrode 44 may be disposed on the upper electrode Cst2 and may supply a current to an intermediate layer including an organic emission layer which is disposed at an upper portion. The current applied to the intermediate layer is transferred to a common electrode (not shown) disposed on the intermediate layer.

Figure 5:
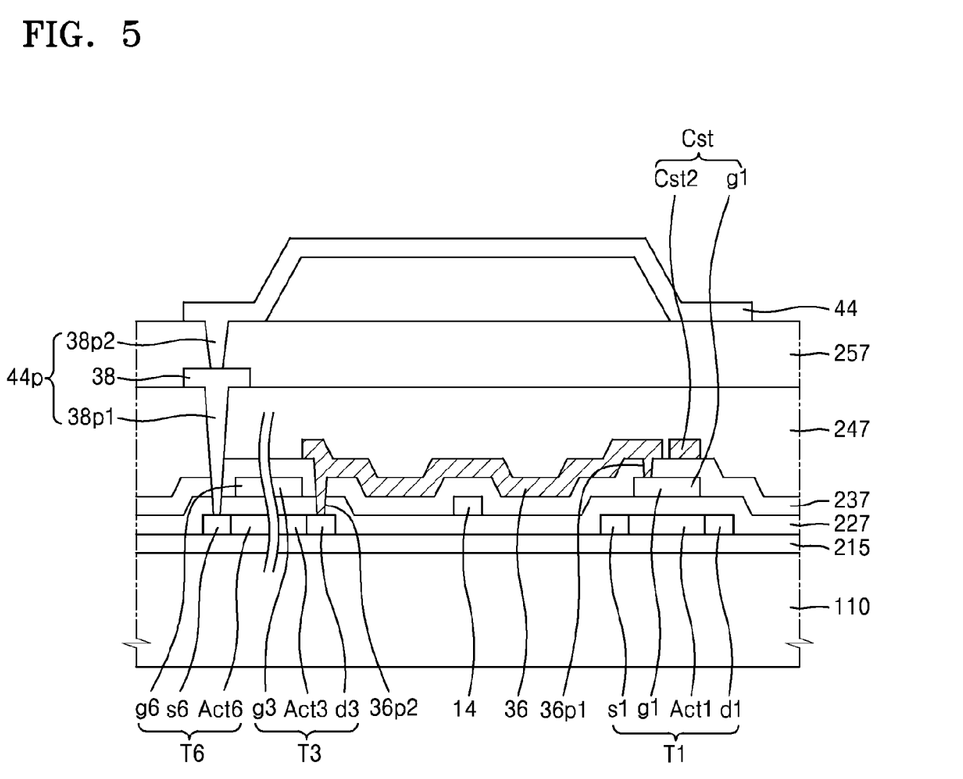
FIG. 5 is cross-sectional view schematically illustrating the one pixel of the display apparatus of FIG. 2, according to an exemplary embodiment of the present invention.

FIG. 5 is a cross-sectional view schematically illustrating the one pixel of the display apparatus of FIG. 2, according to an exemplary embodiment of the present invention. Except for a thickness of the fifth insulating layer 257, cross sectional view illustrated in FIG. 5 may be substantially the same as the cross-sectional view of FIG. 1, and accordingly, repeated description thereof will be omitted.

When a gap between the pixel electrode 44 and the connection node 36 that connects the driving TFT T1 to the compensation TFT T3 is narrow, a parasitic capacitance may occur due to coupling between the connection node 36 and the pixel electrode 44. Accordingly, a potential deviation may occur at a gate of the driving TFT T1 for each pixel or each of sub-pixels R, G and B, which may generate smear and color deviation. The smear and the color deviation may be more problematic in the asymmetrical designing of the pixel electrode or various lines.

A capacitance between both electrodes of the storage capacitor Cst may be expressed as in Equation 1.

$$C = \varepsilon \frac{A}{d} \quad \text{[Equation 1]}$$

C denotes a capacitance, $\in$ denotes a dielectric constant, A denotes an area of the both electrodes which overlap each other, and d denotes a distance between the both electrodes.

When a gap (i.e., a value of d in Equation 1) between the connection node 36 and the pixel electrode 44 increases, a parasitic capacitance "C" of Equation 1 may decrease. Accordingly, potential deviation at the gate electrode of the driving TFT T1 may be prevented. Also, in the asymmetrical designing of a pixel electrode or various lines, occurrence of smear or color deviation may be prevented due to a restriction of a layout.

As illustrated in FIG. 5, a portion of the fifth insulating layer 257 disposed between the line layer 32, 34 and 38 and the pixel electrode 44 is formed to protrude toward the pixel electrode 44. More particularly, a portion of the fifth insulating layer 257 overlapping the pixel electrode 44 may be formed to protrude toward the pixel electrode 44. The portion of the fifth insulating layer 257 may be formed to protrude by performing a photoresist process using a halftone mask. The protruding portion of the fifth insulating layer 257 may overlap entire portion of the pixel electrode 44, or overlap the connection node 36.

As described above, a structure of a pixel that includes a portion of the fifth insulating layer 257 protruding towards the pixel electrode 44 to increase the gap between the connection node 36 and the pixel electrode 44 may be applicable to exemplary embodiments of the present invention.

Hereinafter, exemplary embodiments of the present invention will describe arrangements of the upper electrode of the storage capacitor Cst with reference to FIGS. 6 to 9, while the connection node 36 is formed on the second gate layer as illustrated in FIGS. 1 and 2. The circuit diagrams of FIGS. 3 and 4 may be applicable to the exemplary embodiments illustrated in FIGS. 6 to 9, and accordingly, a repeated description on structures and operations of TFTs T1 to T7, lines 12, 14, 16, 18, 32, 34 and 42 will be omitted.

Figure 6:
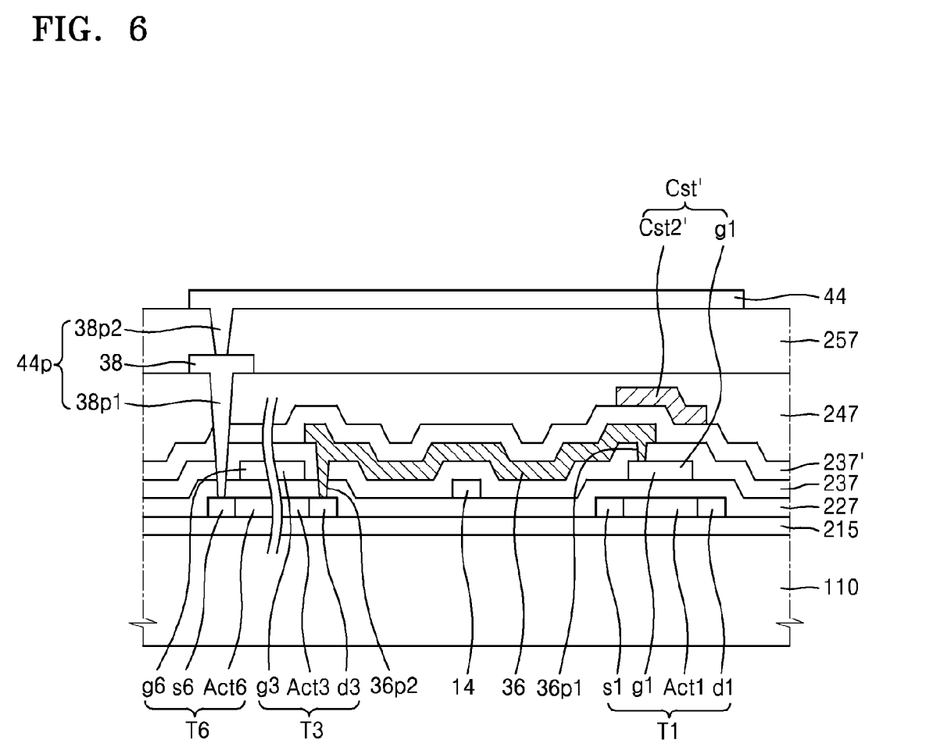
FIG. 6 is a plan view schematically illustrating a pixel circuit of one pixel of a display apparatus according to an exemplary embodiment of the present invention.
Figure 7:
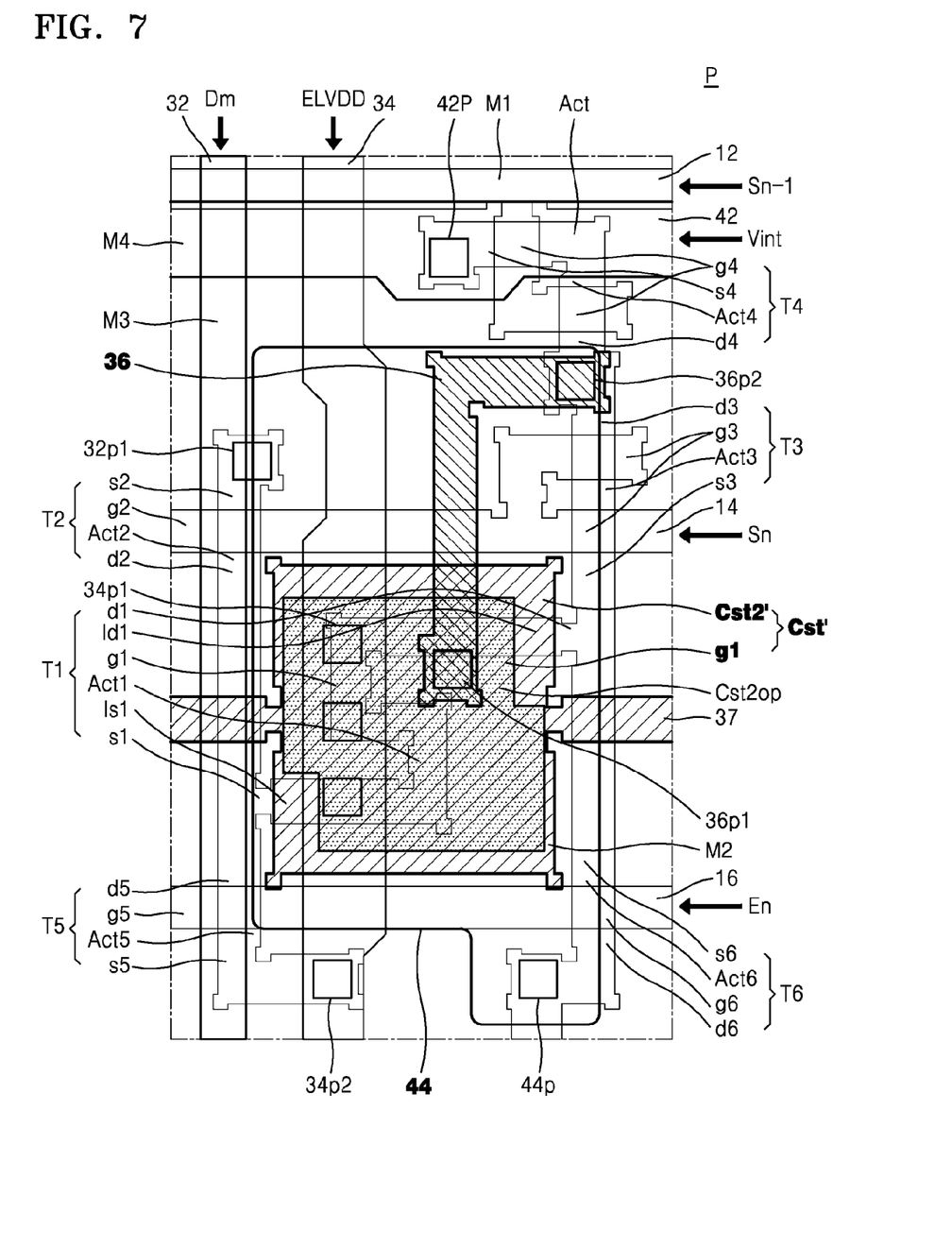
FIG. 7 is a cross-sectional view schematically illustrating the one pixel of the display apparatus of FIG. 6.

FIG. 6 is a plan view schematically illustrating a pixel circuit of one pixel of a display apparatus according to an exemplary embodiment of the present invention. FIG. 7 is a cross-sectional view schematically illustrating the one pixel of the display apparatus of FIG. 6.

Referring to FIGS. 6 and 7, a buffer layer 215 may be formed on a substrate 110, and a semiconductor layer Act including an active region of a TFT is formed on the buffer layer 215. In FIG. 6, for convenience of a description, a driving active pattern Act1 and a portion of each of a compensation active pattern Act3 and an emission control active pattern Act6 is formed.

A first insulating layer 227 is formed of SiNx or SiO2 on the driving active pattern Act1, the compensation active pattern Act3, and the emission control active pattern Act6.

A first gate layer (g1 to g6, 12, 14, and 16), which includes a gate electrode g1 of a driving TFT T1, a gate electrode g3 of a compensation TFT T3, and a gate electrode g6 of an emission control TFT T6 is formed on the first insulating layer 227. In this case, a driving gate electrode g1 of the driving TFT T1 acts as a lower electrode of a storage capacitor Cst'.

As illustrated in FIG. 7, the first gate layer (g1, g2, g3, g4, g5, g6, 12, 14, and 16) includes a driving gate electrode g1, a first scan line 14 including a switching gate electrode g2 and the compensation gate electrode g3, a second scan line 12 including an initialization gate electrode g4, and an emission control line 16 including an operation control gate electrode g5 and an emission control gate electrode g6. In FIG. 7, an area corresponding to the driving gate electrode g1 is illustrated as a dotted area.

The first gate layer (g1 to g6, 12, 14, and 16) and first insulating layer 227 are covered by a second insulating layer 237.

A second gate layer, including a connection node 36 that connects the driving TFT T1 to the compensation TFT T3, is formed on the second insulating layer 237. One end of the connection node 36 is connected to the driving gate electrode g1 of the driving TFT T1 through a first contact plug 36p1, and the other end of the connection node 36 is connected to the compensation active pattern Act3 of the compensation TFT T3 through a second contact plug 36p2. As described above, since the connection node 36 is connected to the compensation active pattern Act3 of the compensation TFT T3 through the second contact plug 36p2, the compensation TFT T3 diode-connects the driving TFT T1.

A third insulating layer 237' is formed on the second gate layer. The third insulating layer 237' is formed of a ceramic-based material such as SiNx or SiO$_2$.

A third gate layer (Cst2' and 37), which includes an upper electrode Cst2' of the storage capacitor Cst' and a connection line 37, is formed on the third insulating layer 237'.

The upper electrode Cst2' configures the storage capacitor Cst' by overlapping the driving gate electrode g1, which acts as a lower electrode, in the form of the floating electrode. As illustrated in FIG. 7, the connection node 36 may be disposed between the upper electrode Cst2' and the driving gate electrode g1 which acts as the lower electrode.

The connection line 37 is formed to connect the upper electrodes Cst2' of respective pixels in a direction where the first scan line 14 extends. Therefore, the connection line 37 forms a mesh structure with a driving voltage line 34 which is formed to intersect the first scan line 14.

A fourth insulating layer 247 is formed on the third insulating layer 237' and the upper electrode Cst2'.

A line layer (32, 34 and 38) is formed on the fourth insulating layer 247, and includes the driving voltage line 34, a data line 32, and a connection member 38. The driving voltage line 34 and the data line 32 are formed in a direction intersecting the first scan line 14. The driving voltage line 34 is connected to the upper electrode Cst2' of the storage capacitor Cst' through a driving voltage line contact plug 34p1.

A drain region d6 of the emission control TFT T6 is connected to the connection member 38 through a third contact plug 38p1 that passes through the first insulating layer 227, the second insulating layer 237, the third insulating layer 237', and the fourth insulating layer 247.

A fifth insulating layer 257, which covers the data line 32, the driving voltage line 34, and the connection member 38, is formed on the fourth insulating layer 247. A pixel electrode 44 is formed on the fifth insulating layer 257. As described above, a portion of the fifth insulating layer 257 overlapping the pixel electrode 44 may be formed to protrude toward the pixel electrode 44.

Figure 8:
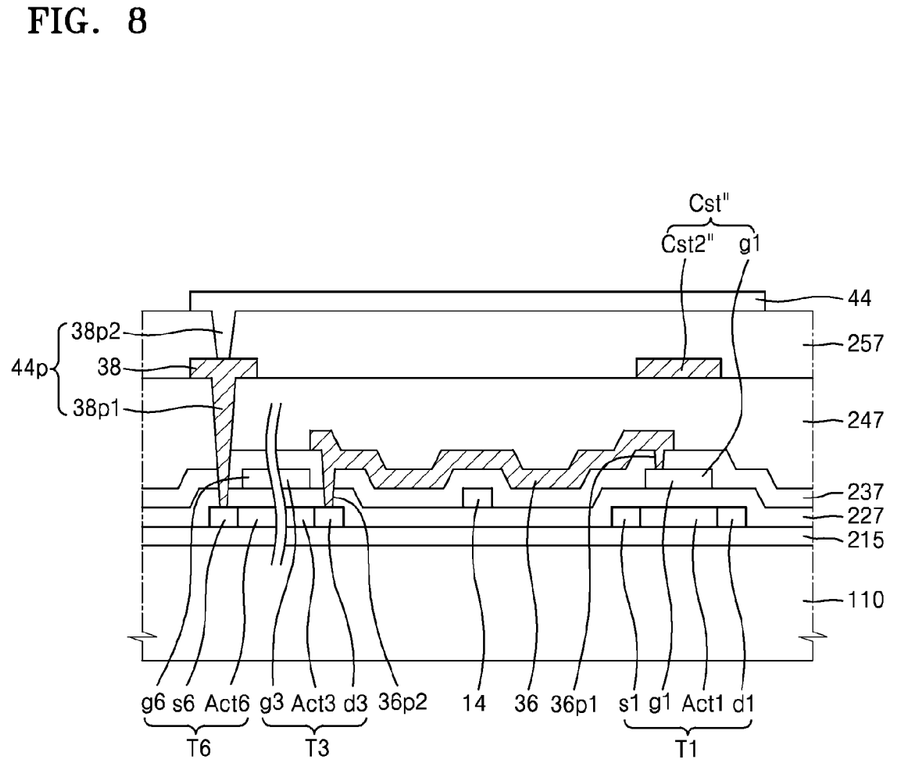
FIG. 8 is a plan view schematically illustrating a pixel circuit of one pixel of a display apparatus according to an exemplary embodiment of the present invention.
Figure 9:
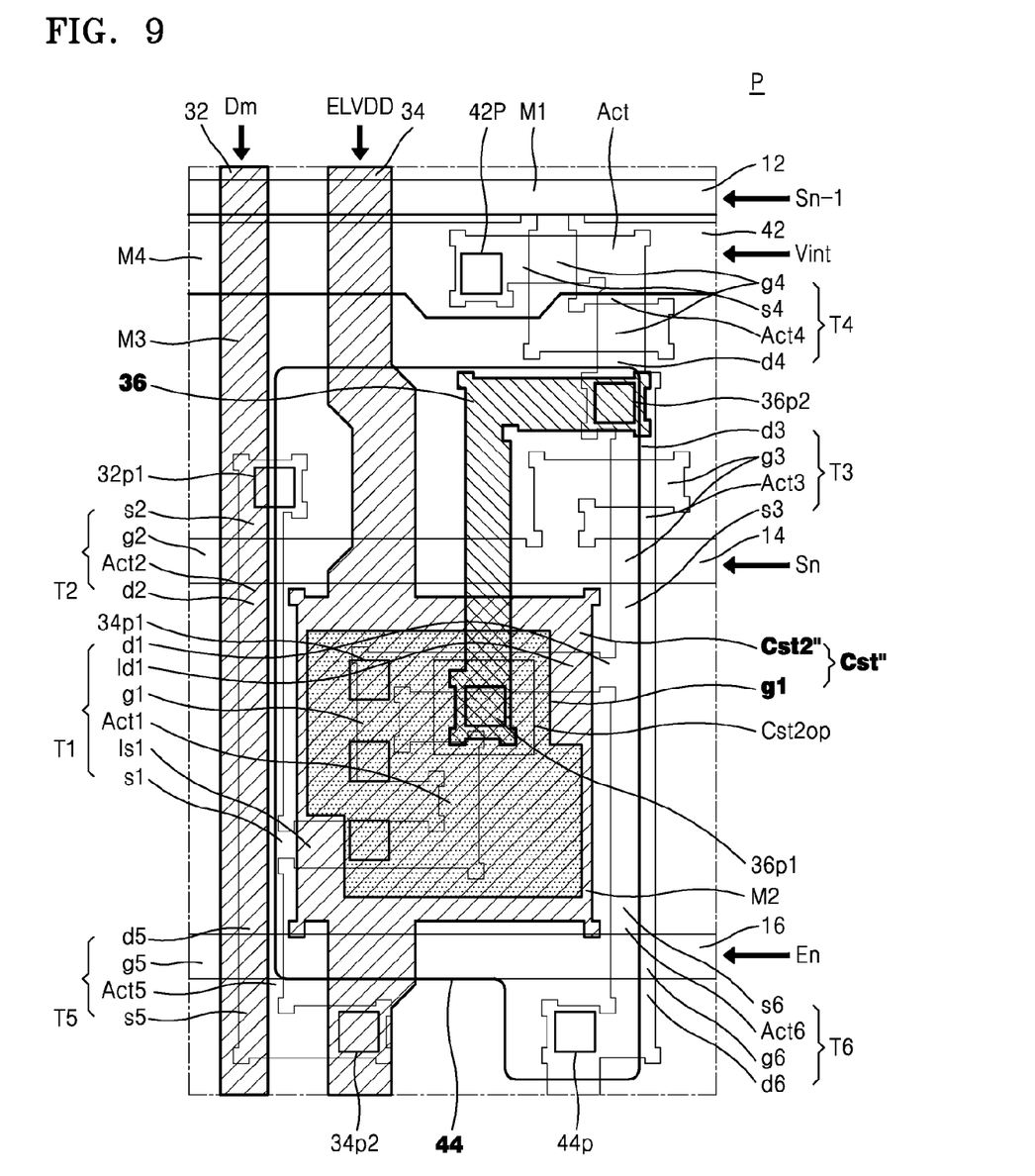
FIG. 9 is a cross-sectional view schematically illustrating the one pixel of the display apparatus of FIG. 8.

FIG. 8 is a plan view schematically illustrating a pixel circuit of one pixel of a display apparatus according to an exemplary embodiment of the present invention. FIG. 9 is a cross-sectional view schematically illustrating the one pixel of the display apparatus of FIG. 8.

Referring to FIGS. 8 and 9, a buffer layer 215 may be formed on a substrate 110, and a semiconductor layer Act including an active region of a TFT is formed on the buffer layer 215. In FIG. 8, for convenience of a description, a driving active pattern Act1 and a portion of each of a compensation active pattern Act3 and an emission control active pattern Act6 is formed.

A first insulating layer 227 is formed of SiNx or SiO2 on the driving active pattern Act1, the compensation active pattern Act3, and the emission control active pattern Act6.

A first gate layer (g1 to g6, 12, 14 and 16), which includes a gate electrode g1 of a driving TFT T1, a gate electrode g3 of a compensation TFT T3, and a gate electrode g6 of an emission control TFT T6, is formed on the first insulating layer 227. In this case, a driving gate electrode g1 of the driving TFT T1 acts as a lower electrode of a storage capacitor Cst".

As illustrated in FIG. 9, the first gate layer (g1, g2, g3, g4, g5, g6, 12, 14, and 16) includes a driving gate electrode g1, a first scan line 14 including a switching gate electrode g2 and the compensation gate electrode g3, a second scan line 12 including an initialization gate electrode g4, and an emission control line 16 including an operation control gate electrode g5 and an emission control gate electrode g6. In FIG. 9, an area corresponding to the driving gate electrode g1 is illustrated as a dotted area.

The first gate layer (g1 to g6, 12, 14 and 16) and first insulating layer 227 are covered by a second insulating layer 237.

A second gate layer, including a connection node 36 that connects the driving TFT T1 to the compensation TFT T3, is formed on the second insulating layer 237. One end of the connection node 36 is connected to the driving gate electrode g1 of the driving TFT T1 through a first contact plug 36p1, and the other end of the connection node 36 is connected to the compensation active pattern Act3 of the compensation TFT T3 through a second contact plug 36p2. As described above, since the connection node 36 is connected to the compensation active pattern Act3 of the compensation TFT T3 through the second contact plug 36p2, the compensation TFT T3 diode-connects the driving TFT T1.

A fourth insulating layer 247 is formed on the second gate layer to cover the connection node 36.

A line layer (Cst2", 32, 34 and 38) is formed on the fourth insulating layer 247, and includes an upper electrode Cst2" of the storage capacitor Cst2", the driving voltage line 34, a data line 32, and a connection member 38.

The upper electrode Cst2" configures the storage capacitor Cst" by overlapping the driving gate electrode g1, which acts as a lower electrode, in the form of the floating electrode. As illustrated in FIG. 9, the connection node 36 may be disposed between the upper electrode Cst2" and the driving gate electrode g1 which acts as the lower electrode.

The upper electrode Cst2" is connected to the driving voltage line 34 through a contact plug 34p1, and receives a driving voltage ELVDD from the driving voltage line 34. Although not shown, a separate connection line may be further formed on a layer different from the line layer (Cst2", 32, 34 and 38) to form a mesh structure with the driving voltage line 34. For example, a connection line may be formed on the first gate layer (g1 to g6, 12, 14 and 16) including a scan line to intersect the driving voltage line 34. Therefore, the driving voltage ELVDD may be supplied to each pixel in a vertical and horizontal direction.

A drain region d6 of the emission control TFT T6 is connected to the connection member 38 through a third contact plug 38p1 that passes through the first insulating layer 227, the second insulating layer 237, a third insulating layer 237', and the fourth insulating layer 247.

A fifth insulating layer 257, which covers the data line 32, the driving voltage line 34, and the connection member 38, is formed on the fourth insulating layer 247. A pixel electrode 44 is formed on the fifth insulating layer 257. As described above, a portion of the fifth insulating layer 257 overlapping the pixel electrode 44 may be formed to protrude toward the pixel electrode 44.

According to the exemplary embodiments of the present invention, a gap between a pixel electrode and a connection line that connects a driving thin-film transistor to another thin-film transistor may be increased to prevent potential deviation at a gate of the driving thin film transistor.

Moreover, according to the exemplary embodiments of the present invention, smear and color deviation that may occur in the asymmetrical designing of the pixel electrode or various lines may be reduced.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display apparatus comprising a pixel comprising a first thin-film transistor (TFT) and a second TFT connected to the first TFT, the display apparatus comprising: a substrate;
   a semiconductor layer disposed on the substrate, the semiconductor layer comprising an active region of the first TFT and an active region of the second TFT;
   a first gate layer disposed on the semiconductor layer, the first gate layer comprising a gate of the first TFT and a gate of the second TFT;
   a second gate layer disposed on the first gate layer, the second gate layer comprising a connection node connecting the gate of the first TFT to the active region of the second TFT; and
   a capacitor comprising a lower electrode and an upper electrode,
   wherein:
   the lower electrode comprises the gate of the first TFT; and
   the upper electrode comprises a portion of the second gate layer.

2. The display apparatus of claim 1, further comprising:
   a first insulating layer disposed between the semiconductor layer and the first gate layer; and
   a second insulating layer disposed between the first gate layer and the second gate layer.

3. The display apparatus of claim 1, wherein the second gate layer comprises the upper electrode.

4. The display apparatus of claim 3, wherein:
   the connection node comprises a contact region connected to the gate of the first TFT through a first contact plug; and
   the contact region is surrounded by the upper electrode, the upper electrode at least partially having a U-shape in a plan view.

5. The display apparatus of claim 1, further comprising a fourth insulating layer disposed between the second gate layer and a line layer.

6. The display apparatus of claim 1, further comprising:
   a pixel electrode disposed on a line layer to overlap the first TFT, the second TFT, the capacitor, and the connection node; and
   a fifth insulating layer disposed between the line layer and the pixel electrode.

7. The display apparatus of claim 1, wherein the connection node is connected to the active region of the second TFT through a second contact plug, and the second TFT connects the first TFT.

8. A display apparatus comprising a pixel comprising a first thin-film transistor (TFT), a second TFT connected to the first TFT, and a capacitor, the display apparatus comprising:
   a substrate;
   a semiconductor layer disposed on the substrate, the semiconductor layer comprising an active region of the first TFT and an active region of the second TFT;
   a first gate layer disposed on the semiconductor layer, the first gate layer comprising a gate of the first TFT and a gate of the second TFT; and
   a second gate layer disposed on the first gate layer, the second gate layer comprising a connection node connecting the gate of the first TFT to the active region of the second TFT,
   wherein:
   the capacitor comprises a lower electrode and an upper electrode;
   the lower electrode comprises the gate of the first TFT; and
   the upper electrode comprises a portion of the second gate layer.

9. The display apparatus of claim 8, further comprising:
   a first insulating layer disposed between the semiconductor layer and the first gate layer; and
   a second insulating layer disposed between the first gate layer and the second gate layer.

10. The display apparatus of claim 8, further comprising a line layer disposed on the second gate layer, the line layer configured to supply a driving voltage to the pixel.

* * * * *